United States Patent [19]
Leach et al.

[11] Patent Number: 5,190,614
[45] Date of Patent: Mar. 2, 1993

[54] METHOD OF ENDPOINT DETECTION AND STRUCTURE THEREFOR

[75] Inventors: Steven C. Leach, Santa Clara; Jewett W. Fowler, Mountain View; Herbert E. Litvak, Palo Alto; Mariste A. Thomson, Santa Clara, all of Calif.

[73] Assignee: Luxtron Corporation, Santa Clara, Calif.

[21] Appl. No.: 578,056

[22] Filed: Sep. 5, 1990

[51] Int. Cl.$^5$ .................. H01L 21/00; G01B 9/02
[52] U.S. Cl. .................... 156/626; 156/668; 156/345; 204/192.33; 204/298.32; 356/357
[58] Field of Search ............. 156/668, 626, 627, 345; 204/192.13, 192.33, 298.03, 298.32; 437/8, 7; 427/10, 8, 9; 118/712, 715, 723, 665; 356/357, 355

[56] References Cited

U.S. PATENT DOCUMENTS

| | | | |
|---|---|---|---|
| 4,454,001 | 6/1984 | Sternheim et al. | 356/355 X |
| 4,462,860 | 7/1984 | Szmanda | 156/626 |
| 4,569,717 | 2/1986 | Ohgami et al. | 156/626 |
| 4,842,410 | 6/1989 | Darrah et al. | 356/357 |
| 5,081,796 | 1/1992 | Schultz . | |

FOREIGN PATENT DOCUMENTS 61-53728 3/1986 Japan .
62-282435 12/1987 Japan .
63-5529 1/1988 Japan .
1-253924 10/1989 Japan .

OTHER PUBLICATIONS

Xinix Model 2200 Instruction Manual, Revision Feb. 1990, Copyright Mar. 1990 (entire manual).

*Primary Examiner*—Thi Dang
*Attorney, Agent, or Firm*—Skjerven, Morrill, MacPherson, Franklin & Friel

[57] ABSTRACT

Methods and apparatus for enhancing the accuracy for detecting the endpoint of certain operations (such as etching, photoresist development or chemical reaction) in the processing of materials which results in a change in the reflectivity or refractive index of the material are provided. The methods decrease the sensitivity of endpoint detection to high frequency noise and periodic oscillations. The methods also allow accurate calculation of overprocessing time and real-time viewing of data by the user.

5 Claims, 9 Drawing Sheets

Microfiche Appendix Included
(94 Microfiche, 1 Pages)

METHOD OF ENDPOINT DETECTION AND STRUCTURE THEREFOR

CROSS REFERENCE TO MICROFICHE APPENDIX

Appendix A, which is part of the present disclosure, is a microfiche appendix consisting of 1 sheet of microfiche with a total of 94 frames. Microfiche Appendix A is a listing of a computer program which is described more completely below.

FIELD OF THE INVENTION

This invention relates to a method of enhancing the accuracy of detecting the endpoint of certain operations (such as etching, photoresist development or chemical reaction) in the processing of materials which processing results in a change in the reflectivity or refractive indices of the materials.

BACKGROUND OF THE INVENTION

A controller for detecting the end of an operation (often called the "endpoint") on a material and particularly on semiconductor wafers will typically detect the endpoint by detecting a change in light being reflected or transmitted from the material. In one system for doing this an optical emitter such as a light-emitting diode (LED) produces light which strikes a wafer surface and is reflected back to an optical detector. In another system natural light produced by a reaction process is monitored by a detector and the rate of change of this natural light in certain frequency bands is used to detect the endpoint of an operation. In both cases the detected light intensity is a measure of the state of the material being processed. The state of the material being processed may be measured by the material's reflectivity, by the chemical constituents of the material, or by the index of refraction of the material. A change in reflectivity indicates the process endpoint for metal etching, while the end of thin-film-interference oscillation signals may signal the endpoint for dielectric etching and photoresist development.

During development and removal of photoresist or during dielectric etching, interference fringes are a direct indication of resist dissolution or dielectric removed. The breakthrough to the underlying substrate (which might be a wafer surface, for example) that occurs when the photoresist or dielectric is removed is referred to as the endpoint and, as shown in FIG. 1, is recognizable as the point where the interference signal becomes nearly flat. The total process time consists of the time (A) which is required to reach breakthrough (endpoint), and any additional time (B) needed to clear out the resist or the dielectric completely. The time (B) is generally referred to as the overdevelopment or overetch period and will depend upon the nature of the material being removed.

The total process time is equal to the sum of the time to endpoint plus the overdevelopment or overetch time. For simplicity, the phrase "overprocess time" will be used in this specification to mean either the overdevelopment time or the overetch time depending on whether a photoresist is being developed and thus removed or a layer of material is being removed.

The actual signals observed can, and in many cases will, vary drastically from an ideal interferogram pattern. Variations in reflectivity from the substrate layers (such as Si, Poly-Si, Al, $SiO_2$ and $Si_3N_4$) topography, substrate roughness, as well as process variables, will affect the strength and characteristics of the reflected signal.

Establishing precise endpoint time is essential in determining the start of the overprocess period, so that the total process time is tightly controlled. A reliable and accurate process control system must be able to recognize the endpoint under any variable signal conditions. For instance, in semiconductor processing where endpoint detection is important, wafer conditions and the wafer-to-sensor distance may vary. In order for the endpoint to be accurately detected, small changes in the reflected light intensity must be measured and changes in light intensity due to effects other than the process being monitored must be eliminated.

Endpoint detection sensors capable of meeting these stringent requirements can suffer from several problems. Ambient light can interfere with the detection of light reflected from the wafer by causing noise in the monitored signal. As the wafer spins during processing, the wafer may wobble or tilt, causing the reflected light to vary. This artifact may interfere with endpoint detection.

SUMMARY OF THE INVENTION

According to this invention, several methods are provided for use with an endpoint controller to remove various artifacts in the signal produced by the detected light. These artifacts can interfere with obtaining the "true" time for endpoint. The methods of this invention decrease the sensitivity of endpoint detection to different types of noise (also called artifacts) such as high-frequency noise, periodic oscillations (for example caused by wafer rotation or vibrations), and slowly varying peaks or valleys. Noise and artifacts such as these interfere with reliable detection of endpoint, and contribute to recorded endpoint times which can be off by as much as a few seconds or more. As critical dimensions in semiconductor products decrease to the submicron range, a few seconds difference in endpoint detection can mean the difference between being within specification or outside of specification.

In one embodiment of this invention, the analog electrical signal generated by the photodiodes which detect light reflected by the material in an endpoint controller is processed and digitized at a selected rate, such as 100 samples/second, as described in the co-pending application, U.S. Ser. No. 07/578,538, entitled "Sensor Board for Endpoint Controller," inventors Raymond J. Cadet, Hung-Nan Chao, Sing-wing Hui, Steven C. Leach, and Eric L. Bogatin, filed the same day as this application and incorporated herein by reference. Of course, the sampling rate can be varied as desired.

In accordance with this invention, each sample is derived from the input signal from photodetectors. Prior to sampling, this input signal is filtered to remove all high frequency noise and components. The filtering leaves signals having a frequency of about 100 cycles per second as the highest frequency component. Endpoint detection however requires signals of a frequency only of approximately 10 cycles per second. Accordingly, sampling at a hundred samples per second is more than adequate to preserve the signal information necessary to detect the endpoint. Naturally, should higher frequency signals need to be detected the sampling rate can be increased as required. The sampling occurs without use of a sample and hold circuit because of the low frequency of the signals being sampled. Each sample is converted by an analog to digital converter into a plurality of binary bits.

Groups of consecutive data samples are combined together to yield a stream of samples at a lower rate, such as 10 samples/second. A linear filter applied to an endpoint controller according to the prior art combines the bits representing 10 samples and produces an output signal representing the average. However, a nonlinear filter applied to an endpoint controller according to one embodiment of this invention discards the highest and the lowest samples, for example, and averages the remaining samples. The number and relative position of the discarded data samples can be altered by the nonlinear filter. This nonlinear filter removes high-frequency glitches better than a linear filter. In fact, the non-linear filter is potentially about two times more efficient at removing high-frequency noise without degrading the low-frequency time response than a linear filter.

One embodiment of this invention takes data which has been processed by the nonlinear filter and further processes this data with a sliding window average which is digitally controllable by the user and which efficiently decreases periodic noise. The width of the sliding window is set by the user to be an integral multiple of the period of the noise. By doing so, the effect of the periodic noise is minimized. Sliding window averaging is critical to good noise reduction for applications in which substrate wobble causes periodic fluctuations of the reflected light and, therefore, periodic fluctuations in the data.

Periodic noise has previously been minimized by using a longer averaging time, meaning averaging more data samples. This method is inefficient at decreasing periodic noise and increases the time response in which an endpoint can be detected. In contrast, choosing the averaging time to be an integral multiple of the periodic noise is extremely efficient in this regard.

False, early endpoints are commonly observed with prior art endpoint controllers. A previous method of minimizing this problem was to wait a user-selected period of time beyond the first detection of the endpoint, and then call that time the endpoint. Although this method minimizes false endpoints, it artificially lengthens the true processing time. The lengthened processing time makes it difficult to do real time data processing and to meet the critical processing specifications required with submicron semiconductor processing.

A method of minimizing false, early endpoints according to this invention defines a user-selected number of "confirming windows" to verify that a local flat region of the measured reflection signal is a true endpoint and not a part of a slowly varying peak or valley. An endpoint controller using this invention defines the initial flattening of the reflection signal (detected as the first window having a level signal) as the endpoint and confirming windows continue to verify that the signal is indeed flat and not just a slowly changing valley or peak. Overprocessing time is calculated as starting after the first window having a level signal. The confirming windows are included in the overprocessing time which is calculated as a percentage of the processing time till endpoint. Because the confirming windows are part of the overprocessing time rather than coming before it, the overprocessing time is not artificially long. Defining the initial flattening of the signal as the endpoint can significantly increase the accuracy of endpoint detection.

"Graphical Auto-Offset" relates to the CRT screen display of the data, such as the data generated by an endpoint controller, especially the signal corresponding to light reflected by a wafer. As real-time data is being plotted on the screen, if the plot should go off the scale of the screen, although the instrument still functions, the user cannot see the data itself. Graphical Auto-Offset will automatically shift the whole data set either up or down 10% of full scale in order to bring the most recently recorded data into view. This feature allows the user to always see the data without adjusting any parameters.

DETAILED DESCRIPTION OF THE DRAWINGS

Figure 6A:
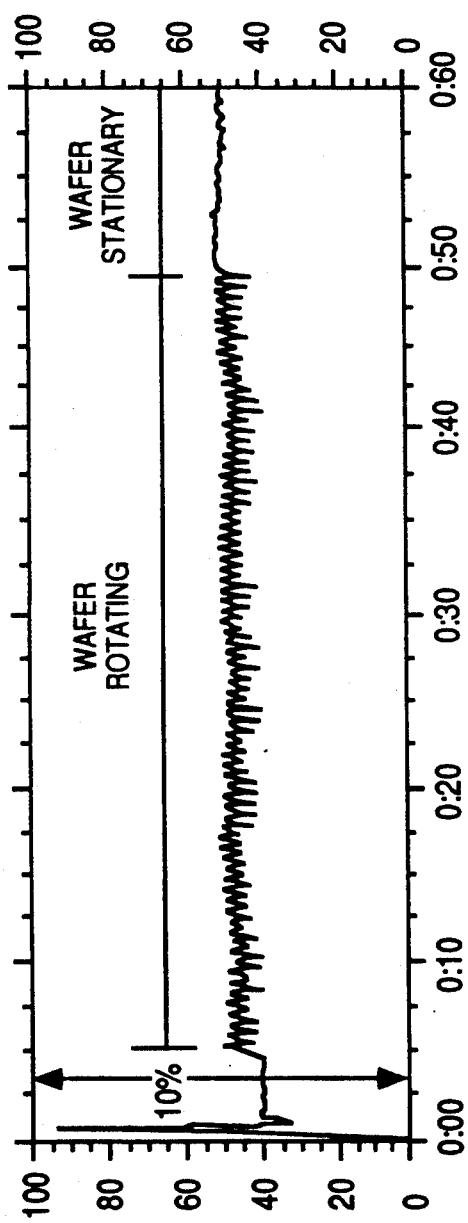
Figure 6B:
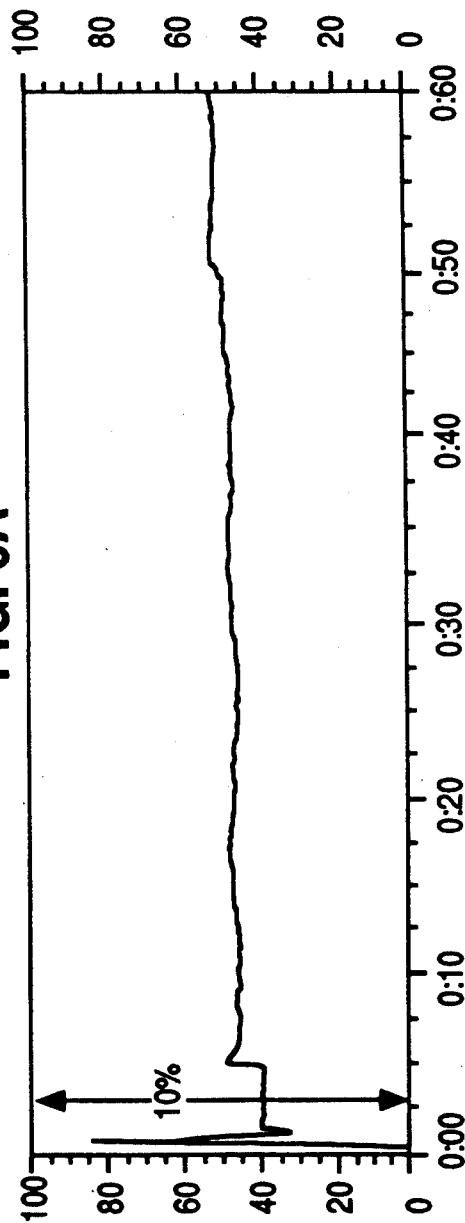
Figure 7:
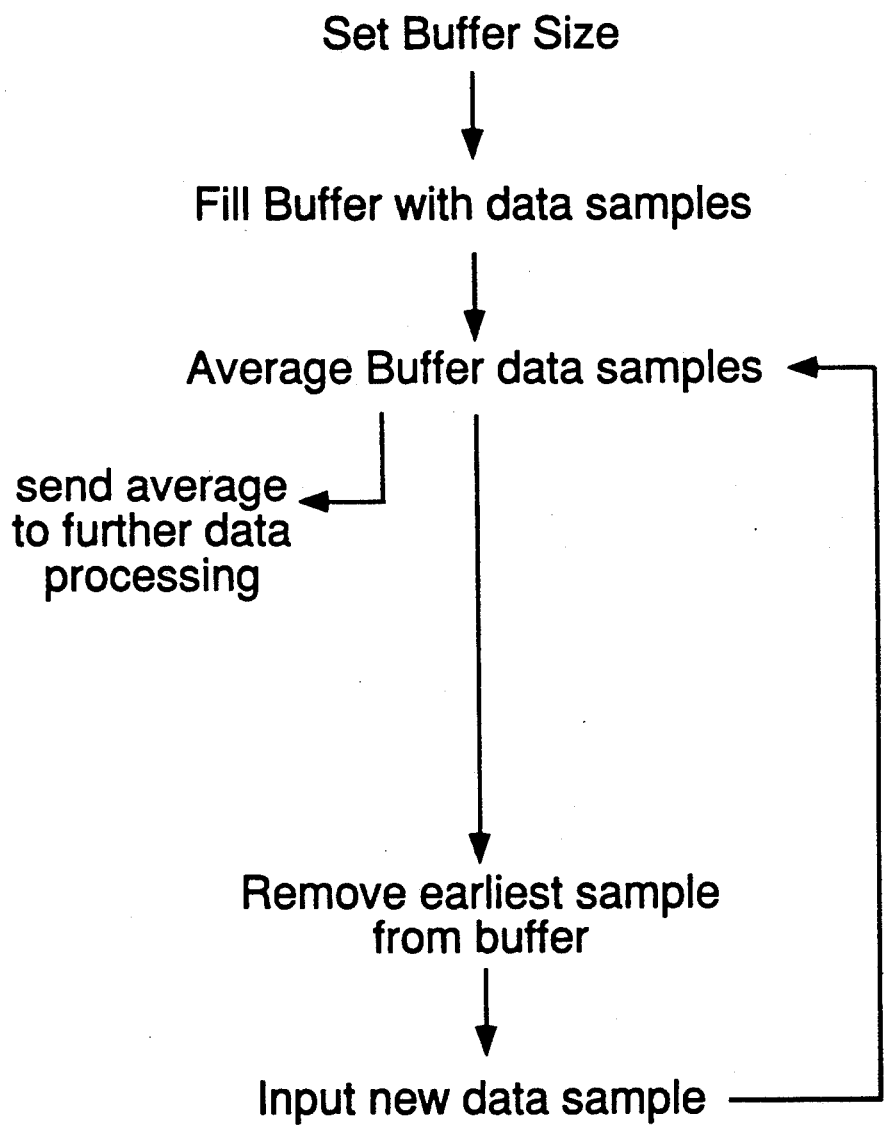
Figure 8:
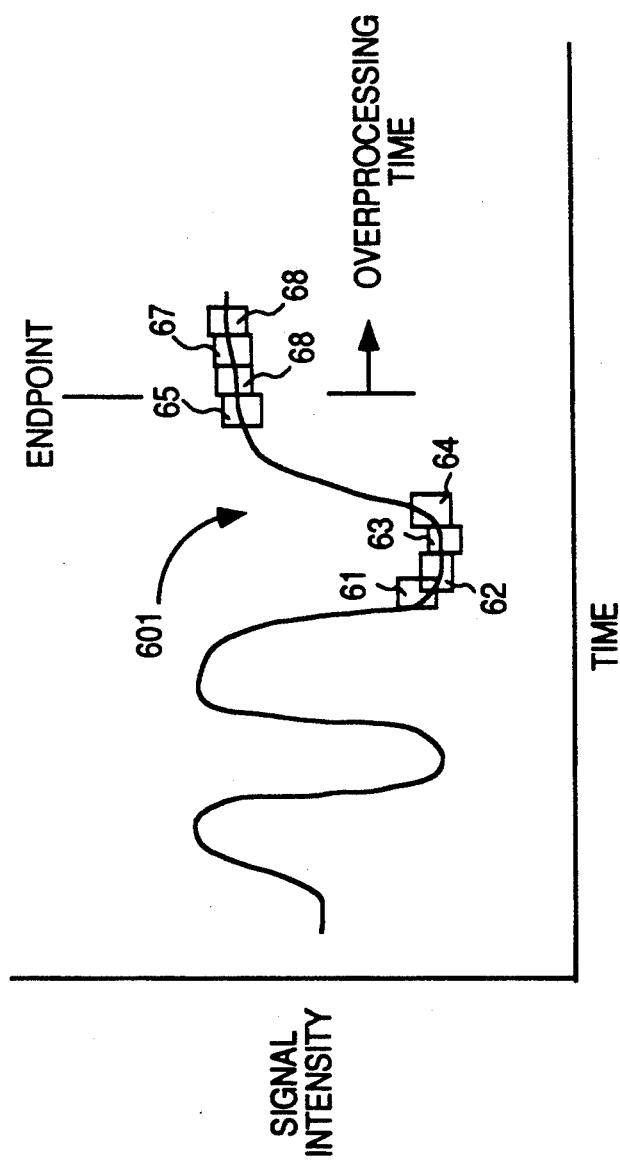
Figure 9:
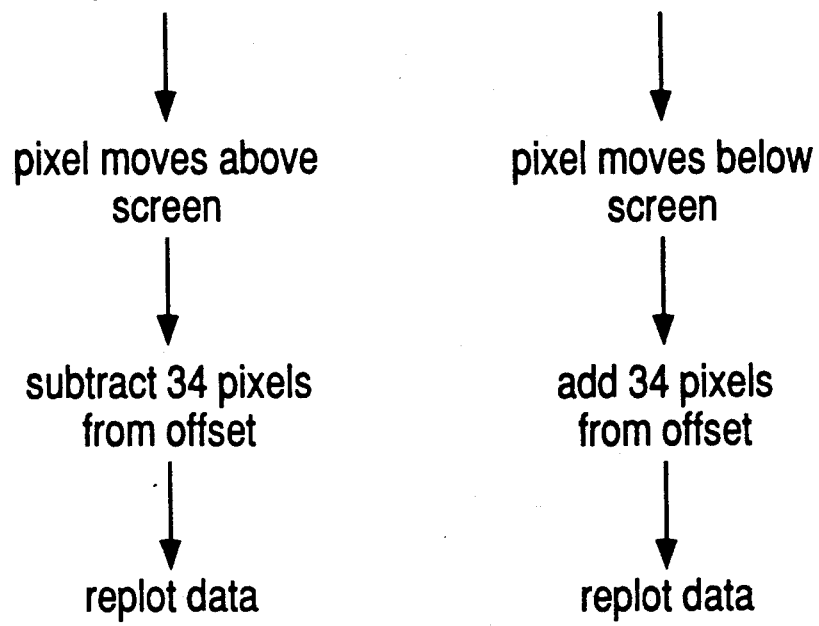

FIGS. 6A and 6B likewise illustrate the effect of integral averaging in removing noise from a photodetector in operation at a test site;

FIG. 7 is a flow chart illustrating the algorithm for use in calculating the integral moving average used to remove the effect of noise as shown in FIGS. 5A, 5B, 6A and 6B;

FIG. 8 illustrates the use of endpoint definition and confirming windows in accordance with this invention; and FIG. 9 illustrates the algorithm for graphical auto-offset in accordance with this invention.

DETAILED DESCRIPTION OF THE INVENTION

The following description of this invention is illustrative only and not limiting. Those skilled in the ar may be able to create other methods and structures by utilizing the principles of this invention based on the following description.

Three software algorithms of this invention, the nonlinear filter, the sliding window, and the confirming windows, reduce noise and enhance the accuracy of endpoint detection when used with an endpoint controller. The fourth algorithm, graphical auto-offset, enables the user to view real-time data, and provides for more accurate determination of endpoint for initially widely varying signals.

Figure 2:
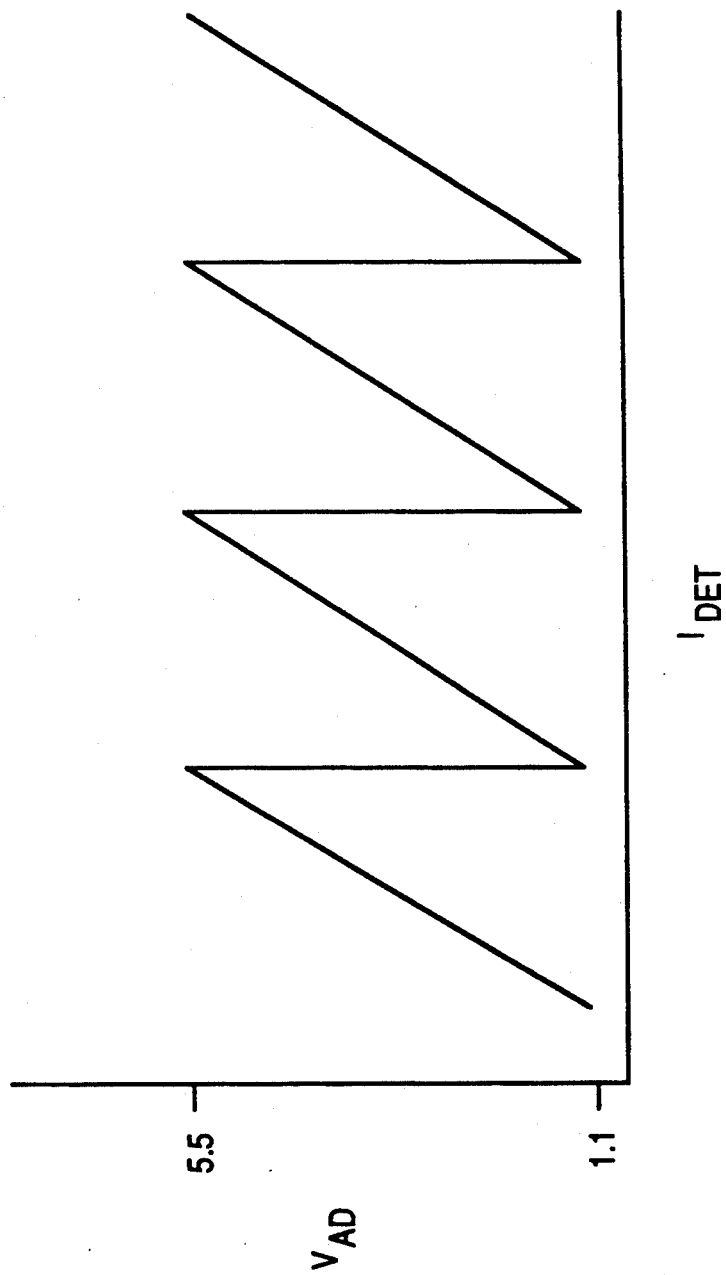
FIG. 2 is a graph of current produced by a photodetector $I_{DET}$ vs. the voltage $V_{AD}$ produced by converting $I_{DET}$ to a voltage and amplifying it to be within a predetermined range.

Data from an endpoint controller is prepared for use with the algorithms of this invention as described below. Using automatic gain control as described in co-pending application "Sensor Board for Endpoint Controller" produces the profile of samples shown in FIG. 2. The digital samples are represented by $V_{AD}$ because they are the result of the analog voltage fed to and digitized by an analog to digital converter. $I_{DET}$ is the current generated by a photodetector which detects light reflected by a substrate. The current $I_{DET}$ is converted to a voltage which is amplified by the value of a resistor R and a programmable gain $G_1$ which combine to give an overall gain value of $RG_1$. The resistance R and gain $G_1$ are chosen to produce a predetermined minimum $V_{AD}$, in this example 1.1 volts. As the current $I_{DET}$ increases $V_{AD}$ increases and the same overall gain value is used until the $V_{AD}$ value reaches a predetermined maximum, in this case 5.5 volts. At that point a lower overall gain value is chosen so that $V_{AD}$ again drops to 1.1 volts. Each saw tooth in FIG. 2 represents one gain stage. The potential $V_{AD}$ can be calculated from the equation $$V_{AD} = (I_{DET} R G_1 - V_{DA}) G_2.$$

$V_{DA}$ is a voltage offset produced by a digital to analog converter. $V_{DA}$ is subtracted from the amplified voltage and $G_2$ is the gain applied after the voltage offset $V_{DA}$ is subtracted. Together the offset $V_{DA}$ and the gain $G_2$ increase the resolution of $V_{AD}$ as described in the copending application, "Sensor Board for Endpoint Control."

To avoid manipulation of several saw tooths, the algorithm calculates $I_{DET}$ from the above equation which can be rearranged to $$I_{DET} = \frac{1}{RG_1} \left( \frac{V_{AD}}{G_2} + V_{DA} \right).$$

The value $V_{DET}$ which is used for further manipulation is simply $I_{DET}$ multiplied by 1 ohm:

$$V_{DET} = I_{DET} (1 \text{ ohm}).$$

Figure 3:
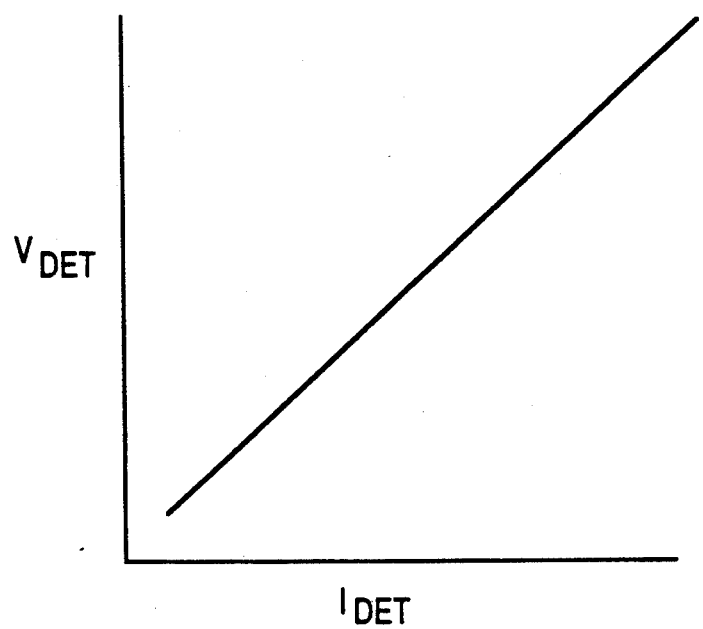
FIG. 3 is a graph of $I_{DET}$ vs. the calculated value $V_{DET}$.

The graph of $V_{DET}$ versus $I_{DET}$ is shown in FIG. 3 as a straight line with a slope of 1. The multiple saw tooth pattern of FIG. 2 has been eliminated. It should be emphasized that $V_{DET}$ and $I_{DET}$ are never actually measured. They are calculated from $V_{AD}$, the measured value, and the known values of R, $G_1$, $G_2$ and $V_{DA}$.

The value $V_{DET}$ is normalized as described below. Normalization of the signal allows the same sized window for endpoint detection and confirmation to be used with a series of processing runs even if some runs produce weaker or stronger signals because the normalization routine produces signal changes having a similar scale.

The normalization algorithm defines a value $V_{AGC}$ which is equal to $V_{DET}$ at the end of the automatic gain control time during which R and $G_1$ are set. A constant AGC-REF is arbitrarily set, in this case at 5 volts. A new voltage $V_{STORE}$ which results from the normalization of $V_{DET}$ is calculated as:

$$V_{STORE} = V_{DET} \left( \frac{AGC - REF}{V_{AGC}} \right) - AGC - REF.$$

$V_{STORE}$ is used with the algorithms of this invention, beginning with the nonlinear filter.

Figure 4:
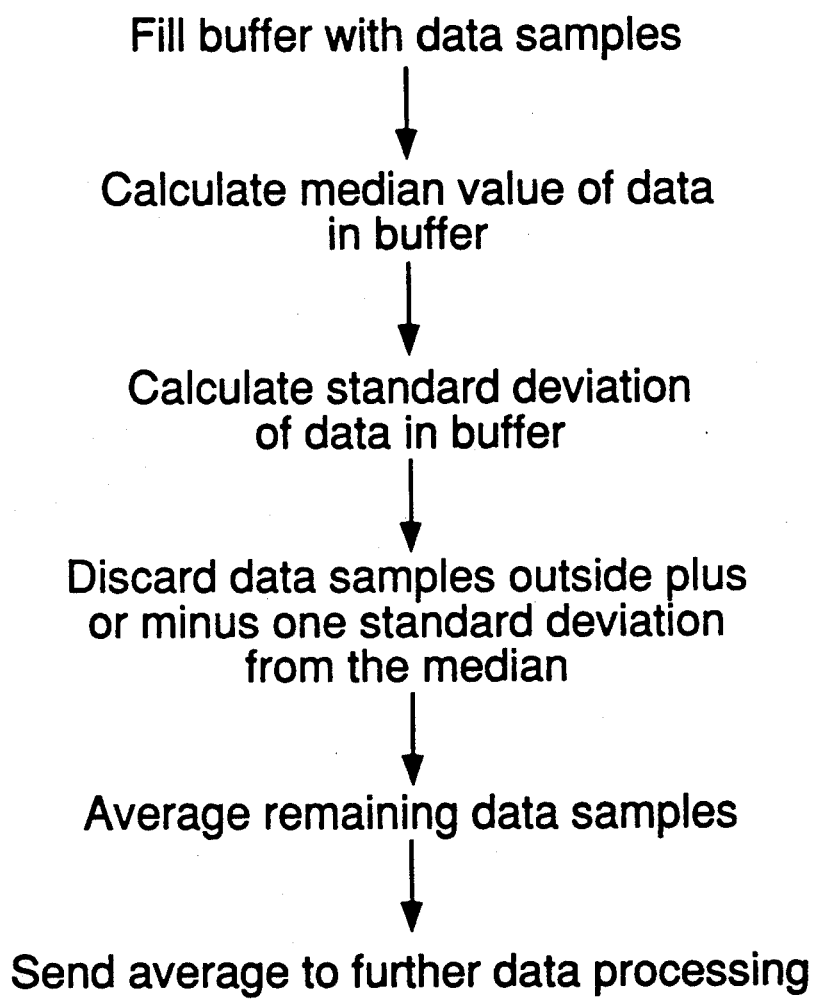
FIG. 4 illustrates a logic flow diagram for certain algorithms used in the nonlinear filter of this invention.

Nonlinear filtering of digitized data minimizes high-frequency noise. An algorithm outline for this process is shown in FIG. 4. Initially, data from an analog to digital converter which has been normalized is used. In one embodiment the data is, for example, digitized data from a sensor board which processes the electrical signal generated by the photodetector (preferably a PIN photodiode) which detects light reflected from a wafer surface as described above for an endpoint controller. The data is stored in a buffer (typically a small amount of memory associated with the computer) until the buffer is full. In one embodiment, the buffer holds eleven data samples. Of course, the buffer can be any appropriate size to hold the amount of data desired to be filtered nonlinearly in accordance with this invention.

Next the data in the buffer is sorted and a median value is calculated. The program selects a number of data samples to average in order to generate one data sample from the group of data samples in the buffer. The program decides which data samples to discard and which data samples to use in calculating the average based on each samples's deviation from the median. In one version of the program, the decision as to which data samples to discard is made by first calculating the standard deviation for the 11 data samples and discarding all data samples which lie outside of the range extending from one standard deviation below the value of the median data sample to one standard deviation above the value of the median data sample. Then the average of the remaining samples is calculated. The resulting average data sample is sent to other processing algorithms which can, for example, detect an endpoint.

The nonlinear filter removes glitches in the digital data. These glitches are data samples which, due to noise, do not lie near the surrounding data samples and, therefore, if not removed, increase the noise level of the resulting average data sample. The nonlinear filter also converts a stream of typically 110 data samples per second to 10 samples per second.

Figure 5A:
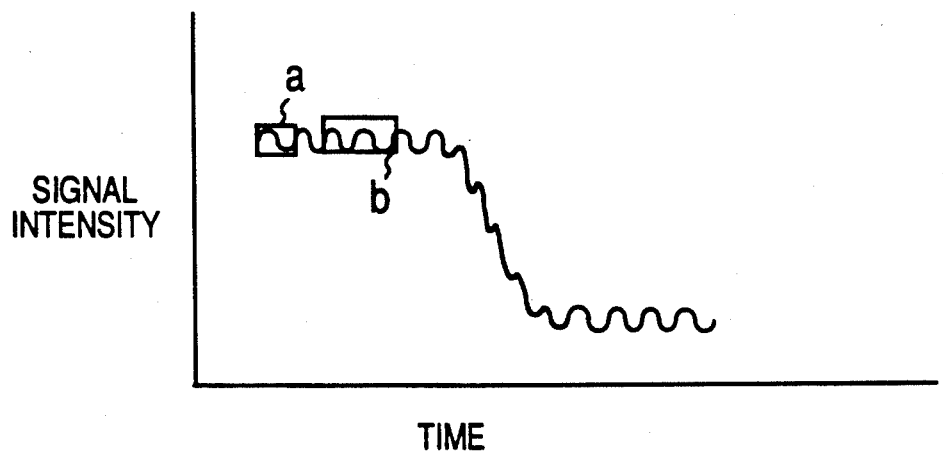
FIGS. 5A and 5B illustrate the way in which periodic noise is removed using integral averaging over a number of cycles of the noise.
Figure 5B:
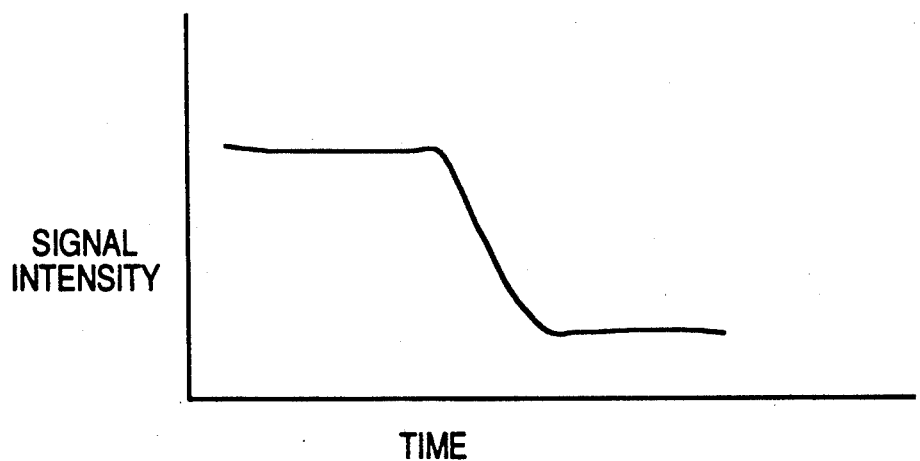

Integral averaging using a sliding window will now be described. The sliding window algorithm removes unwanted oscillatory behavior from the desired signal. FIG. 5A shows the desired signal of FIG. 5B with overlying periodic noise. In an endpoint controller with a spinning wafer, the sinusoidal noise of FIG. 5A was found by us to be due to wobble in the spin axis supporting the wafer. FIG. 5B shows the waveform shown in FIG. 5A after having been reprocessed by the user to remove the periodic noise using the integral averaging method of this invention. In order to implement the integral averaging method of this invention the user takes the data represented in FIG. 5A, which is generated by the processing of a test wafer in the identical environment in which the production wafers will be processed, determines the window size necessary to integrate out the periodic noise and then inputs that window size into the software. Thus the periodic noise which is removed is that noise which is inherently created by the machinery or equipment used in the processing facility and is not random noise.

FIG. 5A illustrates two windows; window A which has a one period length and window B which has a two period length. Naturally windows of a different integral multiple of the period of the noise can be used if desired.

FIG. 6A shows the signal generated by monitoring a bare silicon wafer spinning at 100 rpm with a XINIX Model 2200 endpoint controller. The wobble causes a peak-to-peak noise of about 1% which has a period of 0.6 seconds. A patterned wafer will accentuate this effect. When the size of the sliding window is set correctly as described below, the sinusoidal noise is nearly completely eliminated as shown in FIG. 6B. The window used with the data of FIG. 6A was selected to be two periods of the noise or 1.2 seconds. The noise reflects a wobble with the period of 0.6 seconds although the wafer was rotated at 100 rpm. The residual noise is about 0.1%.

The user controls the smoothing by controlling the width of a window for which the data in that window is averaged. If the width of the window is an integral number of periods, such as the windows shown in FIG. 5A, taking the average of the data in the window will eliminate the sine wave from the desired signal. The size of the window is empirically determined by the user by analyzing the data generated by a test wafer and measuring the length of one period.

The algorithm for the integral moving average is shown in FIG. 7. A buffer (which is merely a portion of the computer memory), whose size corresponds to the width of the window selected by the user, is filled with digital data samples. Typically, these data samples will have already been processed by the nonlinear filter, described above. Next, the program finds the average of all the data samples in the buffer. This average is sent for further processing, for instance to an endpoint detection algorithm. The oldest data sample is removed from the buffer and a new data sample is entered. The average is found for the new data set and this process of a moving average filter continues. Once the buffer is filled, every new raw data sample generates a new averaged data sample.

Initially, when the buffer is empty, a reference value is placed in the buffer which is basically the last value from the A/D converter during the start-up transient time when the system described in copending application "Sensor Board for Endpoint Detection" is determining the proper gains for the whole system in response to the user pressing the start button.

By using the moving average filter, a new, averaged sample will be generated at the same rate as data is processed by the algorithm, typically every tenth of a second. In this way the endpoint can be determined to within a tenth of a second.

Figure 1:
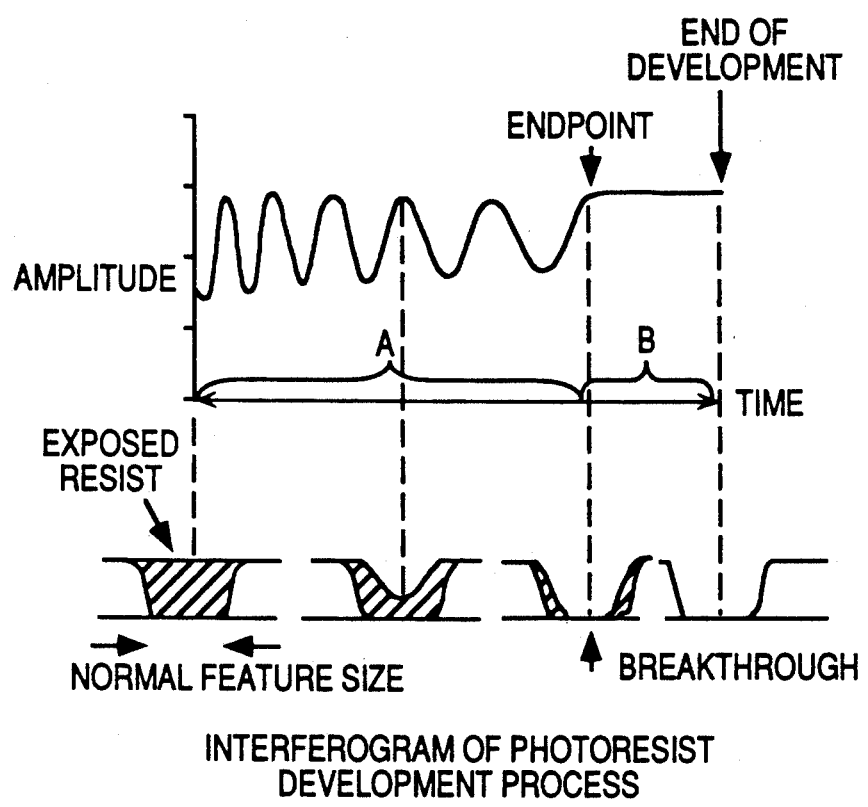
FIG. 1 illustrates an interferogram of a photoresist development process and is of use in explaining the background of this invention.

As explained with reference to FIG. 1, the endpoint is recognizable as the point where the waveform that represents the ongoing chemical process, in this case the interference signal, becomes nearly flat. Alternatively, the endpoint is recognizable as the point where the reflectance signal becomes nearly flat after either rising or falling. The confirming windows algorithm identifies the endpoint and facilitates accurate calculation of the overprocessing time.

Windows such as 61 through 68 in FIG. 8 for which the user can adjust the height and width are used in determining and confirming endpoint. Each window will have a top, bottom, left and right side. More generally, the four sides can simply be numbered and referred to by a number rather than a direction. Furthermore, each window 61 through 68 is positioned vertically so that the signal enters the midpoint of its left-hand edge and positioned horizontally at the point where the signal exits the previous window. A signal passing through a window can be of three possible types. A rising signal will exit the window through the top edge of the window as illustrated by window 64. A falling signal will exit the window through the bottom edge of the window as illustrated by window 61. A level signal will exit the window from the right-hand side of the window as illustrated by windows 62, 63 and 65-68.

In accordance with this invention, one window having a level signal signifies the endpoint. However, peaks and valleys may be wide and slow to change, especially near the end of an etch or development process. In this case, the windows on these peaks and valleys will contain level signals and falsely signify the endpoint, as illustrated by the last valley 601 of FIG. 8 in which both windows 62 and 63 contain level signals so that window 62 signifies an endpoint.

To avoid false endpoint detection such as the endpoint signified by window 62, the user can specify a number N where N is the number of confirming windows plus the window signifying endpoint. To be a confirming window the signal passing through the window must be a level signal for a selected number of consecutive windows. Thus the user may select a series of N windows which in fact turn out not to include confirming windows because the photodetection signal does not exit the sides of N consecutive windows but rather exits the bottom or top of one or more of the N consecutive windows. As shown in FIG. 8, windows 66, 67 and 68 turn out to be confirming windows (assuming N is set to four) because the signal from the photodetector is a level signal which exits the right hand side of each of these three consecutive windows. The peak or valley width may be up to $N-1$ windows without confirming the endpoint of the process. The user may empirically determine the best height, width and number of confirming windows for a specific processing step as described in the XINIX 2200 Instructional Manual, revision February 1990 incorporated herein by reference in its entirety.

Because the first window having a level signal signifies endpoint, overprocessing time beings immediately after that window. Overprocessing time is typically set to be a percentage of the run time till endpoint, usually at least 20%. The confirming windows are included in the overprocessing time rather than coming before it and being included in the run time according to the prior art, so that the overprocessing time is not artificially long. Defining the endpoint as the first window having a level signal and starting overprocessing time immediately after that window facilitates the meeting of critical processing specifications required with submicron semiconductor processing technology. Of course, if the specified number of confirming windows is not found, the measurement of overprocessing time ceases and begins again with zero after the next window having a level signal. Practically, the minimum amount of overprocessing time is the total width of the confirming windows.

Note that it would be possible for the user to select a sequence of confirming windows each vertically offset from the one or two adjacent confirming windows wherein the photodetector signal would pass into a window on its left side and out of the same window on its right side and yet the signal would not be level. The user, however, has the ability to select the elevation change allowed in each adjacent confirming window in order to confirm the endpoint. This is done by adjusting the window height and width. Window width will determine how many data points are in the window. Because 10 data points per second are obtained in one embodiment, a window which contains 10 data points will represent one second of processed signal from the photodetector. In this way, endpoint can be determined to within one second.

The way in which the user varies the window height and width is described in the XINIX 2200 Instructional Manual, revision February 1990.

The confirming window algorithm also insures that a peak or valley, or a rising or falling signal in the case of a reflectance change, must be detected before the endpoint is indicated due to a flat region. This is necessary because the signal from the photodetector (or any other appropriate sensor) may initially be flat before any development or etching takes place. This can happen when, for instance, a photoresist layer to be developed is too thick to allow the transmission of light and thus no thin film interference patterns are generated until a portion of the photoresist layer is removed.

By using a window to look for a level signal to signify endpoint and requiring a number of confirming windows (such as windows 66 to 68 in FIG. 8) to confirm endpoint, endpoint detection is less sensitive to noise. In addition it is possible to sense rising, falling, and level signals without taking derivatives of the signal which decreases the signal to noise ratio. Thus the algorithm of this invention senses the derivative or slope of the signal but does not take the derivative of the signal to detect the endpoint.

The use of windows for detecting endpoints has been described with regard to the removal of a thin film such as photoresist. An etch of metals or nitride however will cause a change in the reflectance at endpoint and therefore a rise or fall in the signal. The windows can also indicate these signal changes and endpoints.

The graphical auto-offset feature of this invention automatically shifts the data set being drawn on a screen during data acquisition either up or down 10% of full scale in order to bring the most recently recorded data into view if that data touches the top or bottom of the screen while it is being drawn.

FIG. 9 shows the algorithm for the graphical auto offset feature. First a pixel which is to be plotted on the screen is calculated from the data signal value according to the formula:

$$\text{pixel} = \text{offset} + \text{gscale (signal value} - \text{reference value)}$$

The gscale parameter is a user selectable scale expansion factor which can scale the view of the data typically from 1 up to 200 in integral steps so that small amplitude signals may be expanded to occupy a useable portion of the normalized 0–100 graphics screen. The gscale value determines the scale of the data plotted on the screen.

The offset is the amount by which the plotted voltage on the display screen is displaced from the zero reference on the display screen at the beginning of data display. At endpoint, a signal may rise or fall, sending it off-scale in one direction. To prevent this from happening, the signal is offset in the opposite direction. The offset value determines where on the screen the data will be initially plotted.

The offset and the gscale values are selected by the user as described in the XINIX Model 2200 Instructional Manual.

The signal value is input to the algorithm as the electrical signal generated by the photodetector after it has been processed as described in the copending patent application entitled "Sensor Board for Endpoint Controller" and filtered as described above.

The reference value is automatically set by the automatic gain control when this algorithm is applied to an endpoint controller such as the XINIX model 2200, 2300 or 2400. The automatic gain control adjusts sensor gain resulting in a $V_{AD}$ between 1.1 volts and 5.5 volts. The gain control compensates for such variables as reflectance variations in the monitored sample and opacity of the processing chemicals. The reference value takes the amount of gain into account when calculating with which pixel to plot the new signal value onto the display screen.

When the calculated pixel at which the data is being plotted touches the top of the screen, 34 rows of pixels are subtracted from the offset (for a screen 340 pixels in length), and the data is replotted. In other words, the data is shifted downward by 10% when the data reaches the upper screen limit. If the pixel at which data is being plotted touches the bottom of the screen, 34 rows of pixels will be added to the offset and the data will be shifted upward by 10% when it is replotted. In general, the data is shifted by 10% of the screen height so the number of pixels to be added or subtracted to the offset will vary with the screen height. In addition, the percentage shift of the data can be varied as desired.

We claim:

1. The method for detecting an endpoint for the processing of a material and calculating an over-processing time for said processing comprising:
   generating electromagnetic radiation and using said radiation to indicate the state of said processing:
   generating from said electromagnetic radiation a waveform representing a measure of said processing;
   providing a first window having four sides, said sides being a first side, a second side, a third side and a fourth side, the first side and third side being opposite each other and the second side and the fourth side being opposite each other, said first, second, third and fourth sides being connected so as to form a closed boundary around said first window;
   placing said first window over said waveform such that said waveform enters said first window through said first side;
   detecting the one of said four sides from which said waveform exits said first window;
   placing a plurality of successive windows, each successive window being substantially identical to said first window, over said waveform such that said waveform enters each of said successive windows through the first side of each of said successive windows as said waveform exits a previous window;
   detecting the one of the four sides of each successive window from which said waveform exits;
   designating the first of said successive windows from which said waveform exits thorough the third side as an endpoint window;
   measuring the time beginning immediately following the exit of said waveform from the third side of said endpoint window; and
   continuing to place said successive windows over said waveform and detecting the one of said four sides from which said waveform exits from each of said successive windows while measuring said over-processing time until a predetermined number of consecutive windows have said waveform exiting through said third side.

2. An apparatus for detecting an endpoint for the processing of a material and calculating an overprocessing time for said processing comprising:
   means for generating electromagnetic radiation and using said electromagnetic radiation to indicate the state of said processing:

means for generating from said electromagnetic radiation a waveform representing a measure of said processing;

means for providing a first window having four sides, said sides being a top side, a bottom side, a right side and a left side;

means for placing said first window over said waveform such that said waveform enters said first window through said left side;

means for detecting which of said four sides said waveform exits said first window;

means for placing a plurality of successive windows, each successive window being identical to said first window, over said waveform such that said waveform enters each of said successive windows through the left side of each of said successive windows as said waveform exits a previous window;

means for detecting the one of the four sides of each successive window from which said waveform exits;

means for designating the first of said successive windows from which said waveform exits thorough the right side as an endpoint window;

means for measuring the said overprocessing time beginning immediately following said endpoint window;

means for continuing to place said successive windows over said waveform and to detect which of said four sides said waveform exits said successive windows while measuring said overprocessing time until a predetermined number of consecutive windows have said waveform exiting through said right side.

3. The apparatus of claim 2 wherein said overprocessing time is a percentage of time from the beginning of said processing to said endpoint.

4. An apparatus for detecting an endpoint for the processing of a material and calculating an overprocessing time for said processing comprising:

means for generating electromagnetic radiation and using said electromagnetic radiation to indicate the state of said processing;

means for generating from said electromagnetic radiation a waveform representing a measure of said processing;

means for providing a first window having four sides, said sides being a first side, a second side, a third side and a fourth side; the first side and the third side being opposite each other and the second side and the fourth side being opposite each other, said first, second, third and fourth sides being connected so as to form a closed boundary around said first window;

means for placing said first window over said waveform such that said waveform enters said first window through said first side;

means for detecting which of said four sides from which said waveform exits said first window;

means for placing a plurality of successive windows, each successive window being substantially identical to said first window, over said waveform such that said waveform enters each of said successive windows through the first side of each of said successive windows as said waveform exits a previous window;

means for detecting the one of the four sides of each successive window from which said waveform exits;

means for designating the first of said successive windows from which said waveform exits thorough the third side as an endpoint window;

means for measuring the time beginning immediately following the exit of said waveform from the third side of said endpoint window; and means for continuing to place said successive windows over said waveform and for detecting the one of said four sides from which said waveform exits from each of said successive windows while measuring said over-processing time until a predetermined number of consecutive windows have said waveform exiting through said third side.

5. Apparatus as in claim 4 wherein said first side and said third side are substantially parallel and said second side and said fourth side are substantially parallel.

* * * * *